US009412744B1

(12) United States Patent
Cheng et al.

(10) Patent No.: US 9,412,744 B1
(45) Date of Patent: Aug. 9, 2016

(54) III-V CMOS INTEGRATION ON SILICON SUBSTRATE VIA EMBEDDED GERMANIUM-CONTAINING LAYER

(71) Applicant: International Business Machines Corporation, Armonk, NY (US)

(72) Inventors: Cheng-Wei Cheng, White Plains, NY (US); Devendra K. Sadana, Pleasantville, NY (US); Kuen-Ting Shiu, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/609,507

(22) Filed: Jan. 30, 2015

(51) Int. Cl.
*H01L 29/66* (2006.01)
*H01L 27/092* (2006.01)
*H01L 27/12* (2006.01)
*H01L 29/205* (2006.01)
*H01L 29/32* (2006.01)
*H01L 21/02* (2006.01)
*H01L 21/8252* (2006.01)

(52) U.S. Cl.
CPC ........ *H01L 27/0922* (2013.01); *H01L 21/0245* (2013.01); *H01L 21/02381* (2013.01); *H01L 21/02546* (2013.01); *H01L 21/8252* (2013.01); *H01L 27/1203* (2013.01); *H01L 29/205* (2013.01); *H01L 29/32* (2013.01)

(58) Field of Classification Search
CPC ............ H01L 27/0922; H01L 27/1203; H01L 27/1207; H01L 29/205; H01L 21/02381; H01L 21/0245; H01L 21/02546; H01L 21/8252

USPC ......................................................... 257/192
See application file for complete search history.

(56) References Cited

U.S. PATENT DOCUMENTS

| 8,575,666 B2 * | 11/2013 | LaRoche | H01L 21/8258 257/291 |
| 2007/0105256 A1 * | 5/2007 | Fitzgerald | H01L 21/76254 438/34 |
| 2011/0180806 A1 * | 7/2011 | Hebert | H01L 29/7787 257/76 |
| 2012/0126291 A1 * | 5/2012 | Mitsunaga | H01L 27/0605 257/195 |
| 2013/0207078 A1 * | 8/2013 | Laboutin | H01L 29/7783 257/20 |

* cited by examiner

*Primary Examiner* — Tu-Tu Ho
(74) *Attorney, Agent, or Firm* — Scully, Scott, Murphy & Presser, P.C.; Louis J. Percello, Esq.

(57) ABSTRACT

After forming a first trench and a second trench extending through a top elemental semiconductor layer present on a substrate including, from bottom to top, a handle substrate, a compound semiconductor template layer and a buried insulator layer to define a top elemental semiconductor layer portion for a p-type metal-oxide-semiconductor transistor, the second trench is vertically expanded through the buried insulator layer to provide an expanded second trench that exposes a top surface of the compound semiconductor template layer at a bottom of the expanded second trench. A stack of a compound semiconductor buffer layer and a top compound semiconductor layer is epitaxially grown on the compound semiconductor template layer within the expanded second trench for an n-type metal-oxide-semiconductor transistor.

19 Claims, 9 Drawing Sheets

III-V CMOS INTEGRATION ON SILICON SUBSTRATE VIA EMBEDDED GERMANIUM-CONTAINING LAYER

BACKGROUND

The present application relates to semiconductor structures, and particularly to semiconductor structures including elemental semiconductor devices and compound semiconductor devices on a common substrate and a method of manufacturing the same.

Complementary metal oxide semiconductor (CMOS) structures that combine compound semiconductor devices and elemental semiconductor devices on a common substrate (e.g., a silicon substrate) are of interest for advanced CMOS technology. Compound semiconductors, particularly III-V compound semiconductors, possess high electron mobility compared to elemental semiconductors, such as, silicon, germanium, or silicon germanium alloys, and are suitable for n-type metal-oxide-semiconductor (NMOS) devices. At the same time, elemental semiconductors possess high hole mobility, and are suitable for p-type metal-oxide-semiconductor (PMOS) devices. However, due to the large lattice mismatch between silicon and compound semiconductors, epitaxially growing a compound semiconductor directly on a silicon substrate produces a poor quality compound semiconductor layer with a high defect density, which could lead to degradation or even failure of the compound semiconductor devices. Therefore, there remains a need to fabricate compound semiconductor devices with a low defect density for CMOS integration.

SUMMARY

The present application provides a heterogeneous CMOS integration structure that monolithically combines a compound semiconductor device having a low defect density with an elemental semiconductor device on a common substrate. After forming a first trench and a second trench extending through a top elemental semiconductor layer present on a substrate including, from bottom to top, a handle substrate, a compound semiconductor template layer and a buried insulator layer to define a top elemental semiconductor layer portion for a p-type metal-oxide-semiconductor transistor, the second trench is vertically expanded through the buried insulator layer to provide an expanded second trench that exposes a top surface of the compound semiconductor template layer at a bottom of the expanded second trench. A stack of a compound semiconductor buffer layer and a top compound semiconductor layer is epitaxially grown on the compound semiconductor template layer within the expanded second trench for an n-type metal-oxide-semiconductor transistor. The closely matched lattice structures of the compound semiconductor buffer layer and the compound semiconductor template layer enable the formation of a top compound semiconductor layer with a low defect density that can be used as a channel layer for a compound semiconductor device for heterogeneous CMOS integration.

According to an aspect of the present application, a semiconductor structure is provided. The semiconductor structure includes a substrate having a handle substrate, a compound semiconductor template layer present on the handle substrate, and a buried insulator layer present on the compound semiconductor template layer, a top elemental semiconductor layer portion present on a first portion of the substrate and in contact with a top surface of the buried insulator layer, and a stack of compound semiconductor layers present on a second portion of the substrate. The stack includes a compound semiconductor buffer layer in contact with a top surface of the compound semiconductor template layer and a top compound semiconductor layer present on the compound semiconductor buffer layer. A lower portion of the stack is laterally surrounded by the buried insulator layer.

According to another aspect of the present application, a method of forming a semiconductor structure is provided. The method include first providing a semiconductor-on-insulator (SOI) substrate comprising a handle substrate, a compound semiconductor template layer present on the handle substrate, a buried insulator layer present on the compound semiconductor template layer, and a top elemental semiconductor layer present on the buried insulator layer. A hard mask layer is then formed over the top elemental semiconductor layer. Next, a first trench and a second trench are formed through the hard mask layer and the top elemental semiconductor layer. The first trench and the second trench expose a top surface of the buried insulator layer. Next, isolation regions are formed around sidewalls of the first trench and the second trench to provide a top elemental semiconductor layer portion laterally surrounded by the isolation regions. After vertically expanding the second trench through the buried insulator layer to provide an expanded second trench that exposes a top surface of the compound semiconductor template layer, the expanded second trench is filled with a dielectric material to provide a second trench fill portion. Next, a portion of the hard mask layer is removed from the top elemental semiconductor portion on which a first semiconductor device is formed. After forming a gate level dielectric layer to cover the first semiconductor device, the second trench fill portion is removed from the expanded second trench to re-expose the top surface of the compound semiconductor template layer. Next, a stack of compound semiconductor layers including a compound semiconductor buffer layer and a top compound semiconductor layer is epitaxially grown within the expanded second trench. A second semiconductor device is then formed on the top compound semiconductor layer.

DETAILED DESCRIPTION

Figure 1:
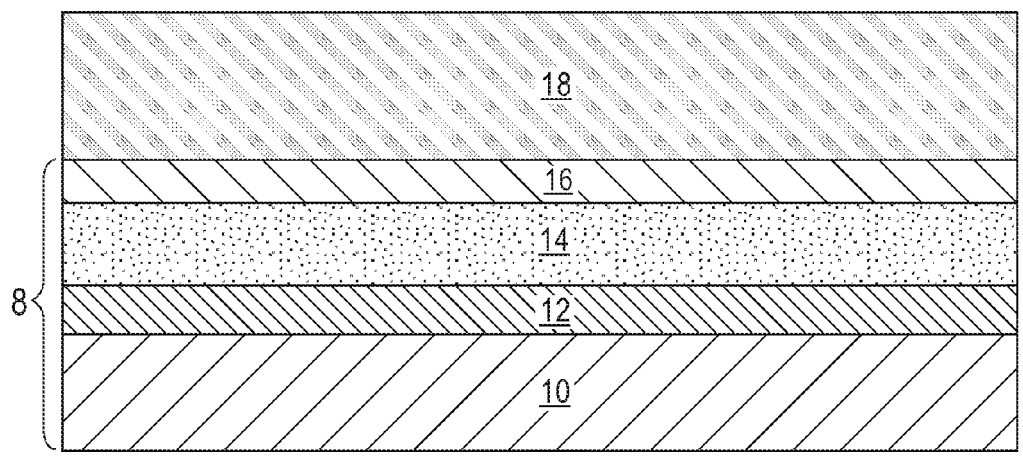
FIG. 1 is a cross-sectional view of an exemplary semiconductor structure after forming a hard mask layer on a semiconductor-on-insulator (SOI) substrate that includes, from bottom to top, a handle substrate, a compound semiconductor template layer, a buried insulator layer and a top elemental semiconductor layer according to embodiments of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, a first exemplary semiconductor structure according to an embodiment of the present application includes a semiconductor-on-insulator (SOI) substrate 8 and a hard mask layer 18 formed thereupon. The SOI substrate 8 includes, from bottom to top, a handle substrate 10, a compound semiconductor template layer 12, a buried insulator layer 14, and a top elemental semiconductor layer 16. The buried insulator layer 14 isolates the top elemental semiconductor layer 16 from the compound semiconductor template layer 12 and the substrate layer 10.

The handle substrate 10 may be a silicon substrate or any semiconductor material so long as the material selected for the handle substrate 10 is different from that of the compound semiconductor template layer 12. In one embodiment, the handle substrate 10 includes single crystalline silicon. The thickness of the handle substrate 10 can be from 50 μm to 2 mm, although lesser and greater thicknesses can also be employed.

The handle substrate 10 can be doped with dopants of a first conductivity type, which can be p-type or n-type. As used herein, the term "p-type" refers to the addition of impurities to an intrinsic semiconductor that creates deficiencies of valence electrons, while the term "n-type" refers to the addition of impurities that contribute free electrons to an intrinsic semiconductor. Exemplary p-type dopants include, but are not limited to, boron, aluminum, gallium and indium. Exemplary n-type dopants include, but are not limited to, antimony, arsenic and phosphorous. In one embodiment, the handle substrate 10 is composed of silicon doped with p-type dopants. The dopants may be introduced to the handle substrate 10 by ion implantation or by an in-situ doping process that is employed while the material of the handle substrate 10 is being formed. The concentration of dopants that are present in the handle substrate 10 is typically greater than $1 \times 10^{15}$ atoms/cm$^3$. In one embodiment, the concentration of dopants that are present in the handle substrate 10 ranges from $1 \times 10^{16}$ atoms/cm$^3$ to $1 \times 10^{17}$ atoms/cm$^3$.

The compound semiconductor template layer 12 may include a material that enables the epitaxial growth of a (i.e., compound semiconductor layer with a low defect density on the handle substrate 10 that can be employed as a channel layer for a compound semiconductor device in a CMOS structure. As used herein, the term "low defect density" means a defect density of less than $1 \times 10^6$ defects/cm$^2$. In one embodiment, the compound semiconductor template layer 12 includes germanium or silicon germanium. The compound semiconductor template layer 12 can be formed by an epitaxial growth. Epitaxial growth and/or deposition" means the growth of a semiconductor material on a deposition surface of a semiconductor material, in which the semiconductor material being grown has the same crystalline characteristics as the semiconductor material of the deposition surface. Thus, an epitaxial film deposited on a <111> crystal surface will take on a <111> orientation. The thickness of the compound semiconductor template layer 12 can be from 10 nm to 1000 nm, although lesser or greater thicknesses can also be employed.

The buried insulator layer 14 may include a dielectric material such as silicon oxide, silicon nitride, silicon oxynitride, or a combination thereof. The buried insulator layer 14 may be formed by a deposition process, such as chemical vapor deposition (CVD), physically vapor deposition (PVD), or atomic layer deposition (ALD). The thickness of the buried insulator layer 14 can be from 50 nm to 180 nm, although lesser or greater thicknesses can also be employed.

The top elemental semiconductor layer 16 may include an elemental semiconductor material, such as for example, silicon, germanium, or silicon germanium. In one embodiment, the top elemental semiconductor layer 16 includes single crystalline silicon. The top elemental semiconductor layer 16 may or may not be doped with p-type dopants and/or n-type dopants. The top elemental semiconductor layer 16 may be formed by a deposition process, such as CVD or plasma enhanced CVD (PECVD), or by layer transfer. When a layer transfer process is employed, an optional thinning step may follow the bonding of two semiconductor wafers together. The optional thinning step reduces the thickness of the semiconductor layer to a layer having a thickness that is more desirable. The thickness of the top elemental semiconductor layer 16 can be from 10 nm to 180 nm, although lesser or greater thicknesses can also be employed.

The hard mask layer 18 disposed over the top elemental semiconductor layer 16 may include a dielectric oxide, a dielectric nitride, a dielectric oxynitride or any combination including multilayers thereof. In one embodiment, the dielectric hard mask material is an oxide such as silicon oxide. The hard mask layer 18 can be formed utilizing a deposition process such as, for example, CVD or PECVD. The thickness of the hard mask layer 18 can be from 10 nm to 100 nm, although lesser or greater thicknesses can also be employed.

Figure 2:
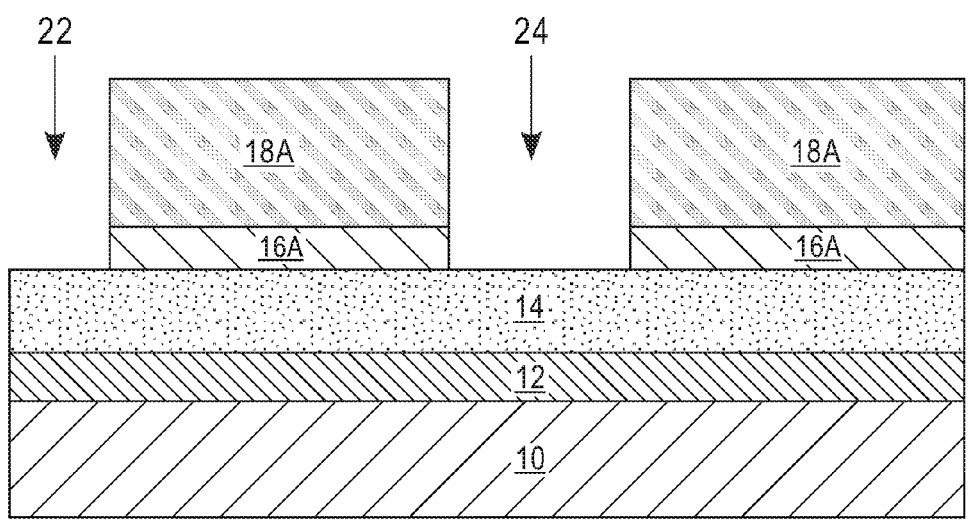
FIG. 2 is a cross-sectional view of a first exemplary semiconductor structure that can be derived from the exemplary semiconductor structure of FIG. 1 after forming a first trench and a second trench through the hard mask layer and the top elemental semiconductor layer according to a first embodiment of the present application.

Referring to FIG. 2, a first trench 22 and a second trench 24 are etched through the hard mask layer 18 and the top elemental semiconductor layer 16. In one embodiment, the first and the second trenches 22, 24 may be formed by first forming a pattern of trench openings in the hard mask layer 18, for example, by applying a photoresist (not shown) on the top surface of the hard mask layer 18, exposing the photoresist to a pattern of radiation, and then developing the pattern into the photoresist utilizing a resist developer. An anisotropic etch such as reactive ion etch (RIE) can then be performed to transfer the pattern of trench openings in the photoresist into the hard mask layer 18. The remaining photoresist can be subsequently removed, for example, by ashing. Subsequently, the pattern of trench openings in the hard mask layer 18 is transferred into the top elemental semiconductor layer 16 by an anisotropic etch that employs the patterned hard mask layer 18 as an etch mask. A surface of the buried insulation layer 14 is physically exposed at the bottom of each of the first and second trenches 22, 24. Remaining portions of the hard mask layer 18 are herein referred to as the hard mask layer portions 18A. The remaining top elemental semiconductor layer 16 is herein referred to as a patterned top elemental semiconductor layer 16A.

The first and second trenches 22, 24 laterally surround a portion of the patterned top elemental semiconductor layer 16A, thus defining a first device region (i.e. PMOS region) that can be used to form an elemental semiconductor device. The second trench 24 defines a second device region (i.e., NMOS region) that is used to form a compound semiconductor device.

Figure 3:
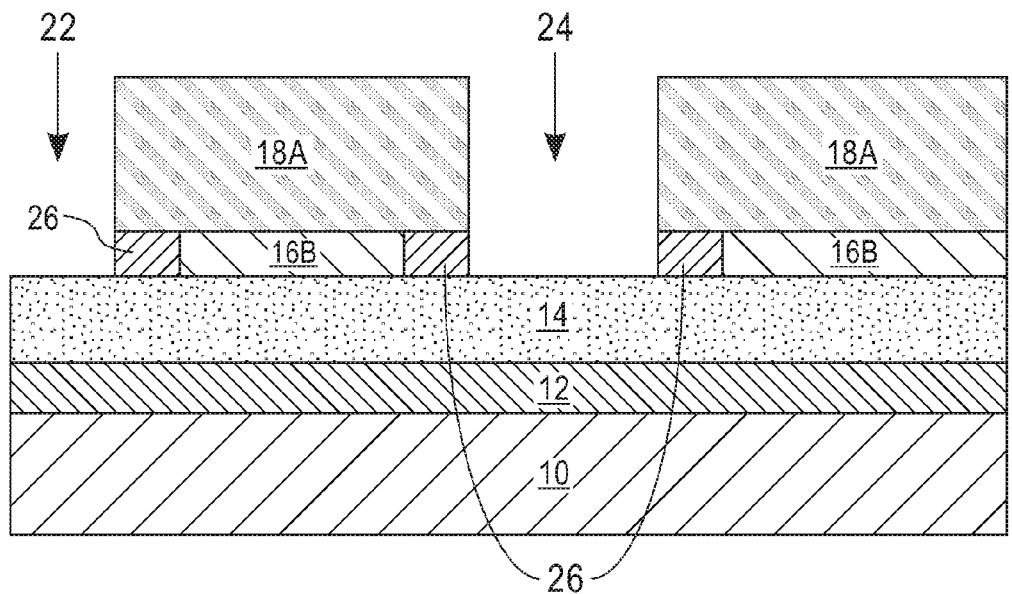
FIG. 3 is a cross-sectional view of the first exemplary semiconductor structure of FIG. 2 after forming isolation regions around sidewalls of the first trench and the second trench to laterally surround a top elemental semiconductor layer portion in a first device region.

Referring to FIG. 3, isolation regions 26 are formed to electrically isolate the first device region and the second device region. In one embodiment, the isolation regions 26 may be formed by performing a thermal oxidation process that oxidizes portions of the patterned top elemental semiconductor layer 16A around the first and the second trenches 22, 24. The thermal oxidation process converts a portion of the semiconductor material of the patterned top elemental semiconductor layer 16A into an oxide of the semiconductor material. In one embodiment and when the top elemental semiconductor layer 16 is composed of silicon, the isolation regions 26 that are formed are composed of silicon oxide. The widths of the isolation regions 26 can be from 10 nm to 50 nm, although lesser and greater thicknesses can also be employed. Remaining portions of the patterned top elemental semiconductor layer 16A that are laterally surrounded by the isolation regions 26 are herein referred to top elemental semiconductor layer portions 16B.

Figure 4:
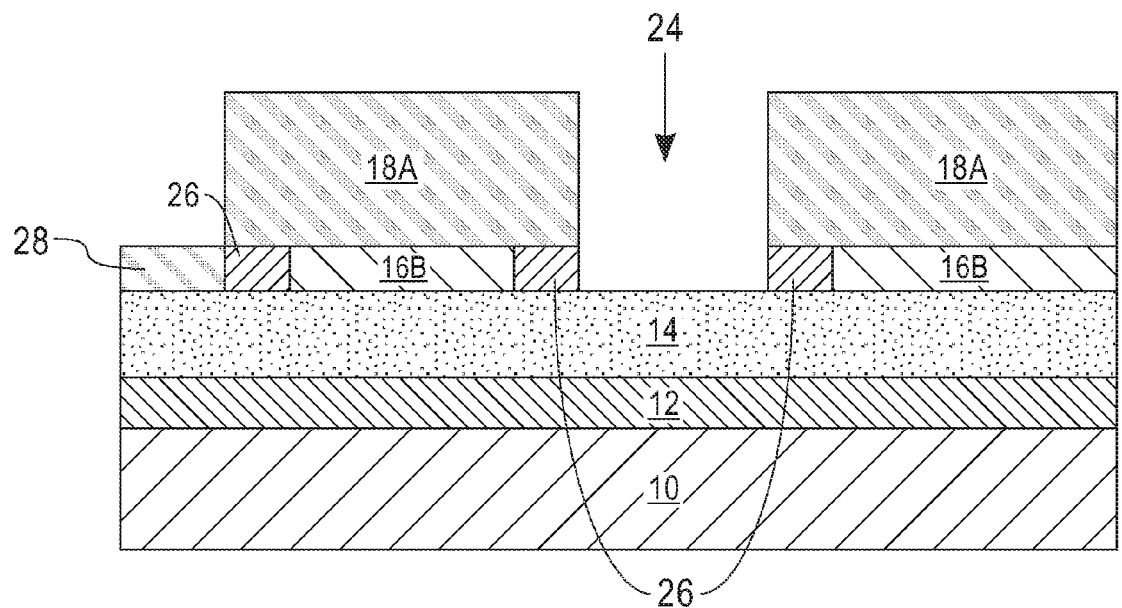
FIG. 4 is a cross-sectional view of the first exemplary semiconductor structure of FIG. 3 after forming a first trench fill portion within the first trench.

Referring to FIG. 4, a first trench fill portion 28 is formed within the first trench 22. A photoresist (not shown) is applied and lithographically patterned so that a patterned photoresist (not shown) covers the second trench 24, while exposing the first trench 22. A dielectric material is deposited within the first trench 22 and above the hard mask layer portions 18A to fill the entirety of the first trench 22. The deposited dielectric material that is formed above the top surfaces of the hard mask layer portions 18A is subsequently recessed to provide the first trench fill portion 28. The first trench fill portion 28 has a top surface coplanar with the top surfaces of the top elemental semiconductor layer portions 16B and isolation regions 26.

The dielectric material employed to form the first trench fill portion 28 can include silicon oxide, and can be deposited by CVD. After forming the first trench fill portion 28, the patterned photoresist can be removed by, for example, ashing.

Figure 5:
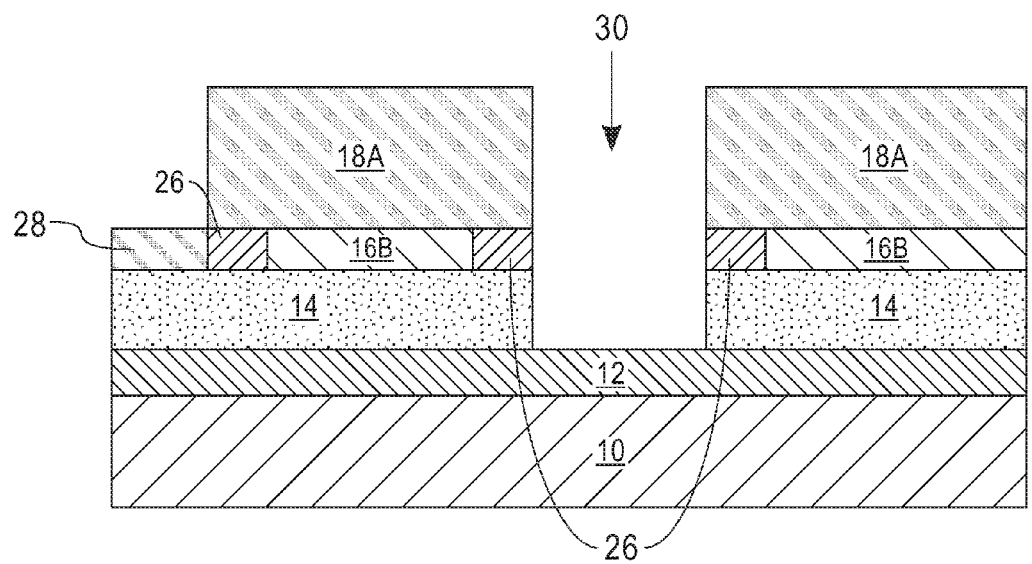
FIG. 5 is a cross-sectional view of the first exemplary semiconductor structure of FIG. 4 after vertically expanding the second trench through the buried insulator layer to provide an expanded second trench that defines a second device region.

Referring to FIG. 5, the second trench 24 is vertically expanded through the buried insulator layer 14 such that a surface of the compound semiconductor template layer 12 is physically exposed at the bottom of the expanded second trench 30. The expanded second trench 30 has a high aspect ratio. As used herein, an aspect ratio refers to the ratio of the height of a trench to the minimum lateral dimension between sidewalls of the trench. A trench having an aspect ratio greater than 1.0 is herein referred to as a "trench having high aspect ratio." The vertical expansion of the second trench 24 can be performed by an anisotropic etch, which can be a dry etch such as, for example, reactive ion etch (RIE).

Figure 6:
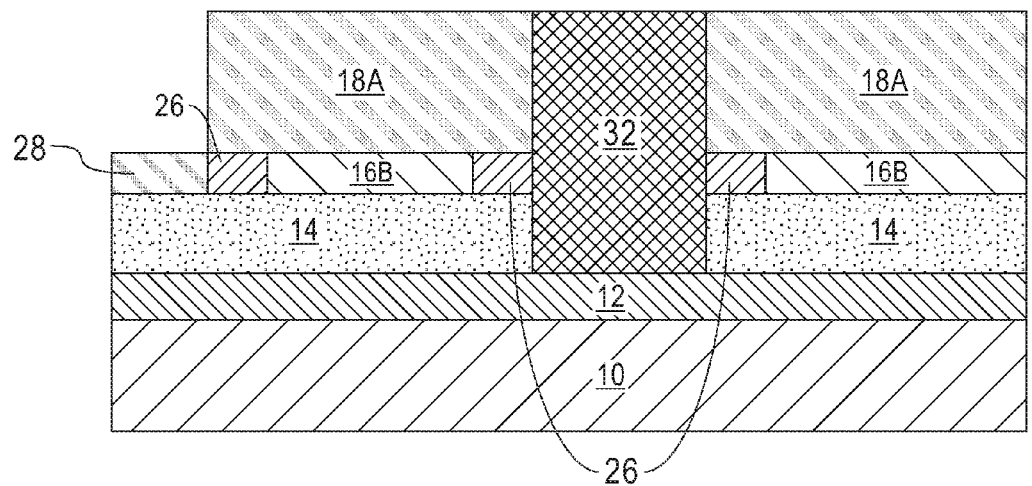
FIG. 6 is a cross-sectional view of the first exemplary semiconductor structure of FIG. 5 after forming a second trench fill portion within the expanded second trench.

Referring to FIG. 6, a second trench fill portion 32 is formed to completely fill the expanded second trench 30. The second trench fill portion 32 can be formed by depositing a dielectric material that is different from the dielectric material of the hard mask layer 18, for example, by CVD, and by planarizing the deposited dielectric material employing the hard mask layer portions 18A as a stopping layer. The second trench fill portion 32 can include a material selected from silicon oxide, nitrogen-doped organosilicate glass, and silicon nitride. In one embodiment and when the hard mask layer 18 includes silicon oxide, the second trench fill portion 32 may include silicon nitride. The planarization of the deposited dielectric material can be performed, for example, by chemical mechanical planarization (CMP), a recess etch, or a combination thereof. In one embodiment, the top surface of the second trench fill portion 32 is coplanar with the top surfaces of the hard mask layer portions 18A.

Figure 7:
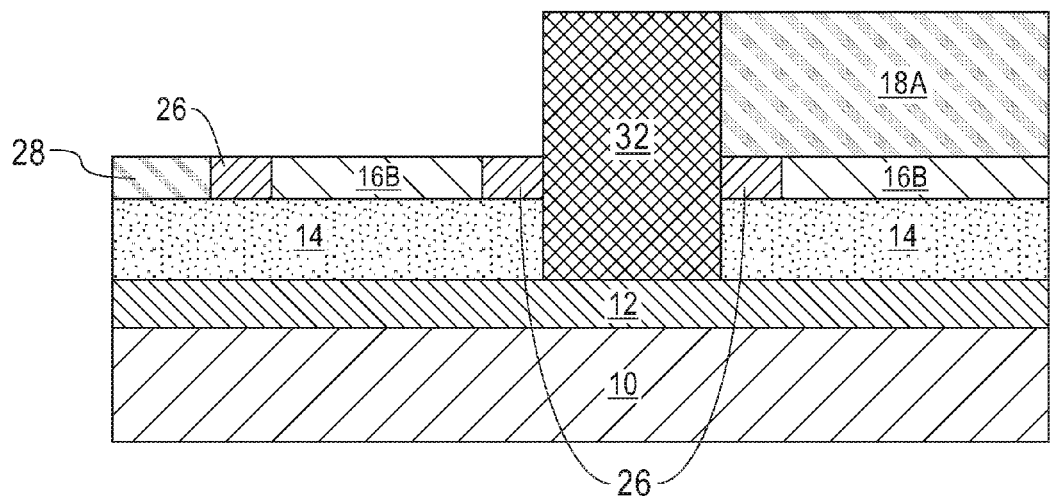
FIG. 7 is a cross-sectional view of the first exemplary semiconductor structure of FIG. 6 after removing a hard mask layer portion from the top elemental semiconductor layer portion and the isolation regions in the first device region.

Referring to FIG. 7, the hard mask layer portion 18A that is located in the first device region is removed selective to the dielectric material of the isolation regions 26 and the semiconductor material of the top elemental semiconductor layer portions 16B, thus exposing the top elemental semiconductor layer portion 16B located in the first device region. A photoresist (not shown) is applied and lithographically patterned so that a patterned photoresist (not shown) including an opening that exposes the first device region is formed. The exposed hard mask layer portion 18A is subsequently removed by a dry etch or a wet etch. In one embodiment and when the hard mask layer 18 is composed of silicon oxide, the wet etch can employ dilute hydrofluoric acid (HF). After removing the exposed hard mask layer portion 18A, the patterned photoresist can be removed by, for example, ashing.

Figure 8:
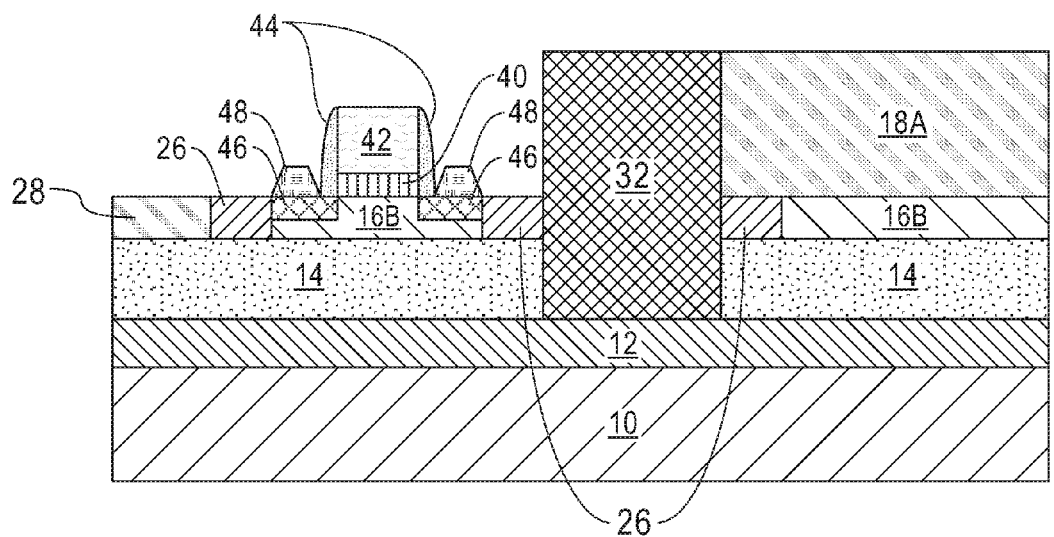
FIG. 8 is a cross-sectional view of the first exemplary semiconductor structure of FIG. 7 after forming a p-type metal-oxide-semiconductor (PMOS) transistor in the first device region.

Referring to FIG. 8, conventional CMOS processes may be performed to form a PMOS transistor including a first gate structure (40, 42, 44), first source/drain regions 46, and first raised source/drain regions 48 in the first device region.

The first gate structure (40, 42, 44) may include a first gate stack of a first gate dielectric 40 that is present on a channel portion of the top elemental semiconductor layer portion 16B and a first gate electrode 42 that is present on the first gate dielectric 40, and first gate spacers 44 present on sidewalls of the first gate stack (40, 42). The first gate stack (40, 42) can be formed by depositing a stack of gate material layers (not shown) including a first gate dielectric layer and a first gate electrode layer by a deposition process, such as CVD or PVD, and subsequent patterning the stack of the gate material layers by anisotropic etch.

The first gate dielectric 40 may be composed of a dielectric material, such as silicon oxide, or alternatively a high-k dielectric, such as $HfO_2$, $ZrO_2$, $La_2O_3$, $Al_2O_3$, $TiO_2$, $SrTiO_3$, $LaAlO_3$ or $Y_2O_3$. The first gate dielectric 40 can have a thickness from 1 nm to 10 nm, although lesser and greater thicknesses can also be employed.

The first gate electrode 42 may be composed of a doped semiconductor material, such as doped polysilicon, an elemental metal, such as tungsten, titanium, tantalum, aluminum, nickel, ruthenium, palladium and platinum, or an alloy that includes at least one of the aforementioned elemental metals. The first gate electrode 42 can have a thickness from 10 nm to 100 nm, although lesser and greater thicknesses can also be employed.

The first gate spacers 44 may include a dielectric material such as, for example, silicon oxide or silicon nitride. The first gate spacers 44 can be formed by depositing a conformal dielectric layer (not shown) around the first gate stack (40, 42) and removing horizontal portion of the conformal dielectric layer by anisotropic etch such as RIE. The remaining vertical portions of the conformal dielectric layer on the sidewalls of the first gate stack (40, 42) constitute the first gate spacers 44. The width of the first gate spacers 44, as measured at the base, can be from 2 nm to 50 nm, although lesser and greater widths can also be employed.

A first source region and a first drain region (collectively referred to as first source/drain regions 46) may be formed in portions of the top elemental semiconductor layer portion 16A on opposite sides of the first gate stack (40, 42) by implanting p-type dopants employing the first gate stack (40, 42) as an implantation mask. Examples of p-type dopants include, but are not limited to, boron, aluminum, gallium and indium.

A first raised source region and a first raised drain region (collectively referred to as first raised source/drain regions 48) are then formed atop the first source/drain regions 46, for example, by a selective epitaxy process. During the selective epitaxy process, the semiconductor material grows only on exposed semiconductor regions, i.e., first source/drain regions 46 and does not grow on dielectric surfaces, such as surfaces of the first gate spacers 44, the hard mask layer portions 18A, the isolation regions 26, the first trench fill portion 28, and the second trench fill portion 32. The first raised source/drain regions 48 can be formed in epitaxial alignment with the first source/drain regions 44. In one embodiment, the first raised source/drain regions 48 may be composed of silicon germanium. The first raised source/drain regions 48 are doped with p-type dopants. The doping of the first raised source/drain regions 48 can be performed during deposition of the first raised source/drain regions 48 by in-situ doping, or can be performed by ion implantation after deposition of the first raised source/drain regions 48. The p-type dopants in the first source/drain region 46 and the first raised source/drain regions 48 can be activated subsequently using a rapid thermal process.

Figure 9:
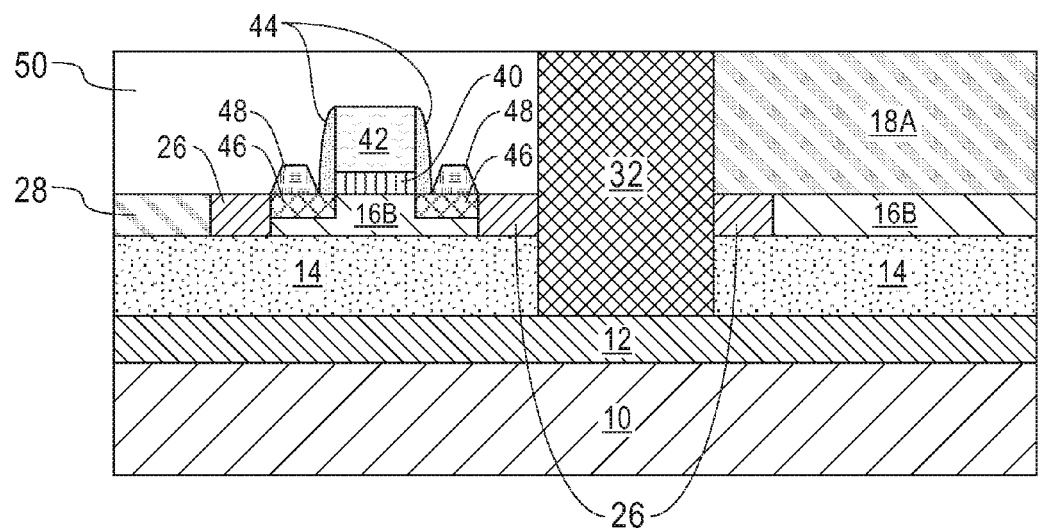
FIG. 9 is a cross-sectional view of the first exemplary semiconductor structure of FIG. 8 after forming a gate level dielectric layer to cover the entirety of the PMOS transistor.

Referring to FIG. 9, a gate level dielectric layer 50 is deposited to cover the entirety of the PMOS transistor in the first device region. The gate level dielectric layer 50 may include a dielectric material that is different from the dielectric material of the second trench fill portion 32 so that the second trench fill portion 32 can be subsequently removed selective to the gate level dielectric layer 50. For example, the gate level dielectric layer 50 may include silicon nitride, silicon oxynitride, organosilicate glass (OSG) or silicon oxide. In one embodiment and when the second trench fill portion 32 is composed of silicon nitride, the gate level dielectric layer 50 may include silicon oxide. The gate level dielectric layer 50 can be formed, for example, by CVD or spin-coating. The gate level dielectric material layer 50 can be self-planarizing, or the top surface of the gate level dielectric layer 50 can be planarized, for example, by CMP. The top surface of the gate level dielectric layer 50 is coplanar with the top surfaces of the second trench fill portion 32 and the remaining hard mask layer portion 18A after the planarization process.

Figure 10:
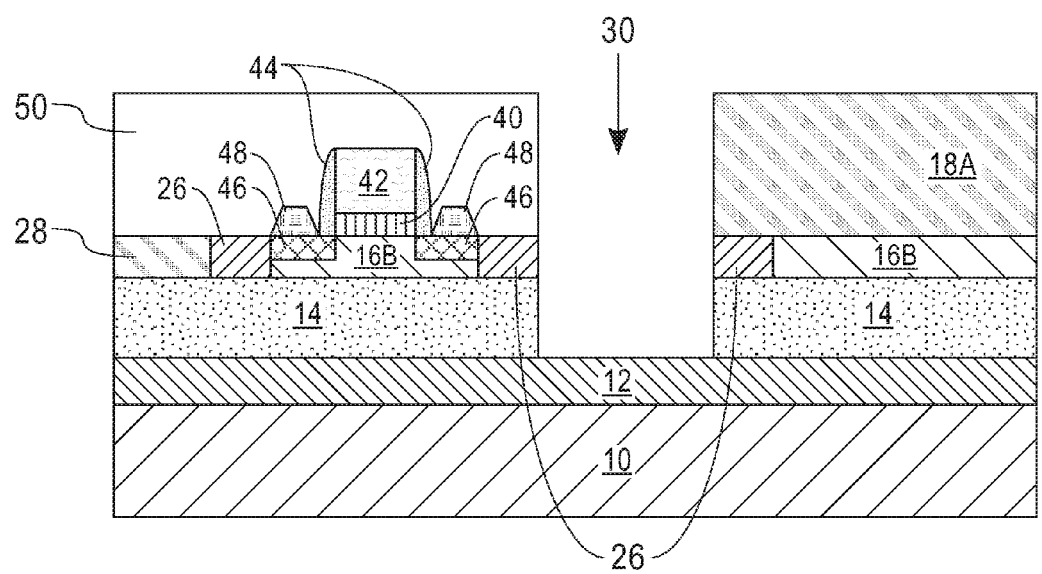
FIG. 10 is a cross-sectional view of the first exemplary semiconductor structure of FIG. 9 after removing the second trench fill portion from the expanded second trench.

Referring to FIG. 10, the second fill portion 32 is removed from the expanded second trench 30 employing an etch chemistry that etches the dielectric material of the second trench fill portion 32 selective to the dielectric materials of the buried insulator layer 14, the remaining hard mask layer portion 18A, the isolation regions 26 and the gate level dielectric layer 50. For example, if the second trench fill portion 32 includes silicon nitride, a wet etch employing hot phosphoric acid can be employed to remove the second trench fill portion 32. The removal of the second trench fill portion 32 re-exposes the portion of the compound semiconductor template layer 12 that is physically exposed at the bottom of the expanded second trench 30.

Figure 11:
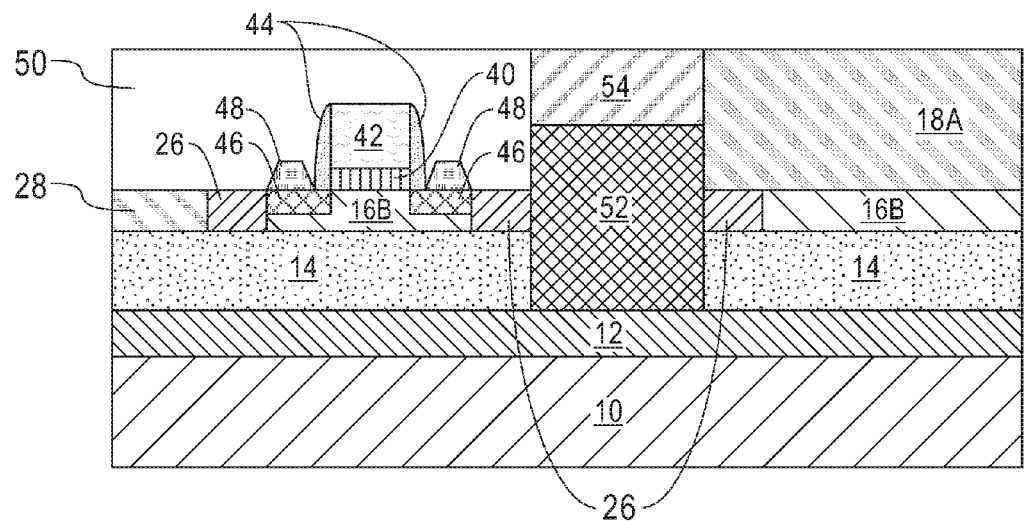
FIG. 11 is a cross-sectional view of the first exemplary semiconductor structure of FIG. 10 after forming a stack of a compound semiconductor buffer layer and a top compound semiconductor layer within the expanded second trench.

Referring to FIG. 11, a stack including, from bottom to top, a compound semiconductor buffer layer 52 and a top compound semiconductor layer 54 is formed within the expanded second trench 30 and over the portion of the compound semiconductor template layer 12 that is physically exposed at the bottom of the expanded second trench 30. In one embodiment of the present application, the topmost surface of the stack (52, 54) is coplanar with the top surfaces of the gate contact level dielectric layer 50 and the remaining hard mask layer portion 18A.

The compound semiconductor buffer layer 52 may include a first III-V compound semiconductor material having a first band gap. The first III-V compound semiconductor material typically has a good lattice match with the underlying compound semiconductor template layer 12 such that a compound semiconductor buffer layer 52 with a low defect density can be formed. Examples of the first III-V compound semiconductor material include, but are not limited to, InP, GaAs, InAlAs, AlAs, AlGaAs, or InGaAs. Additionally, the compound semiconductor buffer layer 52 may be doped with iron, chromium, titanium, or vanadium to impart a semi-insulating property to the compound semiconductor buffer layer 52. The compound semiconductor buffer layer 52 thus electrically isolates the top compound semiconductor layer 54 to be subsequently formed from the compound semiconductor template layer 12 and the handle layer 10. The compound semiconductor buffer layer 52 may be grown by a selective epitaxial process such as, for example, molecular beam epitaxy (MBE), metal-organic chemical vapor deposition (MOCVD), or any other well-known epitaxial technique, so that the compound semiconductor buffer layer 52 can be formed in epitaxial alignment with the compound semiconductor template layer 12. The compound semiconductor buffer layer 52 that is formed may have a thickness from 50 nm to 500 nm, although lesser and greater thicknesses can also be employed.

The top compound semiconductor layer 54 that is formed on the top surface of the compound semiconductor buffer layer 52 may include a second III-V compound semiconductor material having a second band gap that is smaller than the first band gap of the first III-V compound semiconductor material employed in the compound semiconductor buffer layer 52. As used herein, the term "band gap" refers to the energy difference between the top of the valence band (i.e., EV) and the bottom of the conduction band (i.e., EC). Examples of the second III-V compound semiconductor material include, but are not limited to, InGaAs, InAs, GaAs, or InP. The top compound semiconductor layer 54 may be grown by a selective epitaxial process such as, for example, MBE, MOCVD, or any other well-known epitaxial technique, so that the top compound semiconductor layer 54 can be formed in epitaxial alignment with the compound semiconductor buffer layer 52. The top compound semiconductor layer 54 that is formed may have a thicknesses from 5 nm to 50 nm, although lesser and greater thicknesses can also be employed.

In the present application, since a wide band gap material is used for the compound semiconductor buffer layer 52 and a narrow band gap material is used for the top compound semiconductor layer 54, carriers can be confined in the top compound semiconductor layer under the normal CMOS operation conditions. In addition, since the compound semiconductor layer 52 is formed directly on the compound semiconductor template 12 having a closely lattice matched structure with that of the handle substrate 10, and the top compound semiconductor layer 54 is formed directly on the compound semiconductor buffer layer 52 whose crystal structure and electronic properties are similar to those of the top compound semiconductor layer 54, a top compound semiconductor layer 54 having a low defect density can be obtained in the present application.

Figure 12:
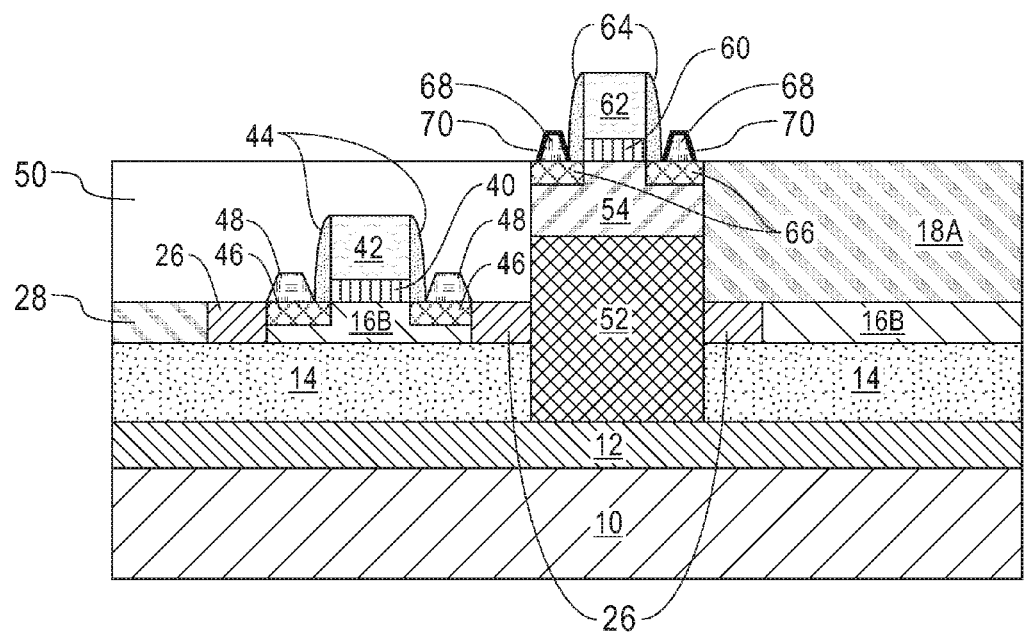
FIG. 12 is a cross-sectional view of the first exemplary semiconductor structure of FIG. 11 after forming an n-type metal-oxide-semiconductor (NMOS) transistor in the second device region.

Referring to FIG. 12, conventional CMOS processes may be performed to form a NMOS transistor including a second gate structure (60, 62, 64), second source/drain regions 66, and second raised source/drain regions 68 in the second device region.

The second gate structure (60, 62, 64) may include a second gate stack of a second gate dielectric 60 that is present on a channel portion of the top compound semiconductor layer 54 and a second gate electrode 62 that is present on the second gate dielectric 60, and second gate spacers 64 present on sidewalls of the second gate stack (60, 62). The second gate stack (60, 62) can be formed by depositing a stack of gate material layers (not shown) including a second gate dielectric layer and a second gate electrode layer by a deposition process, such as CVD or PVD, and subsequent patterning the stack of the gate material layers by anisotropic etch.

The second gate dielectric 60 may be composed of a dielectric material the same as or different from the dielectric material of the first gate dielectric 40. For example, the second gate dielectric 60 includes silicon oxide, or alternatively a high-k dielectric, such as $HfO_2$, $ZrO_2$, $La_2O_3$, $Al_2O_3$, $TiO_2$, $SrTiO_3$, $LaAlO_3$ or $Y_2O_3$. The second gate dielectric 60 can have a thickness from 1 nm to 10 nm, although lesser and greater thicknesses can also be employed.

The second gate electrode 62 may be composed of a conductive material the same as or different from the conductive material of the first gate electrode 42. For example, the second gate electrode 62 includes a doped semiconductor material, such as doped polysilicon, an elemental metal, such as tungsten, titanium, tantalum, aluminum, nickel, ruthenium, palladium and platinum, or an alloy that includes at least one of the aforementioned elemental metals. The second gate electrode 62 can have a thickness from 10 nm to 100 nm, although lesser and greater thicknesses can also be employed.

The second gate spacers 64 may include a dielectric material the same as or different from the dielectric material of the first gate spacers 44. For example, the second gate spacers 64 include silicon oxide or silicon nitride. The second gate spacers 44 can be formed by depositing a conformal dielectric layer (not shown) around the second gate stack (60, 62) and removing horizontal portion of the conformal dielectric layer by anisotropic etch such as RIE. The remaining vertical portions of the conformal dielectric layer on the sidewalls of the second gate stack (60, 62) constitute the second gate spacers 64. The width of the second gate spacers 64, as measured at the base, can be from 2 nm to 50 nm, although lesser and greater widths can also be employed.

A second source region and a second drain region (collectively referred to as second source/drain regions 66) may be formed in portions of the top compound semiconductor layer 54 on opposite sides of the second gate stack (60, 62) by implanting n-type dopants employing the second gate stack (60, 62) as an implantation mask. Examples of n-type dopants include, but are not limited to, n-type dopants include, for example, silicon, germanium, and tellurium.

A second raised source region and a second raised drain region (collectively referred to as second raised source/drain regions 68) are then formed atop the second source/drain regions 66, for example, by a selective epitaxy process. During the selective epitaxy process, the semiconductor material grows only on exposed semiconductor regions, i.e., second source/drain regions 66 and does not grow on dielectric surfaces, such as surfaces of the second gate spacers 64, the remaining hard mask portion 18A and the gate level dielectric layer 50. The second raised source/drain regions 68 can be formed in epitaxial alignment of the second source/drain regions 64. In one embodiment, the second raised source/drain regions 68 may be composed of InGaAs. The second raised source/drain regions 68 are doped with n-type dopants. The doping of the second raised source/drain regions 68 can be performed during deposition of the second raised source/drain regions 68 by in-situ doping, or can be performed by ion implantation after deposition of the second raised source/drain regions 68. The n-type dopants in the second source/drain region 66 and the second raised source/drain regions 68 can be activated subsequently using a rapid thermal process.

A source metal semiconductor alloy portion and a drain metal semiconductor alloy portion (collectively referred to as source/drain metal semiconductor alloy portions 70) can be optionally formed, by deposition of a metal layer on physically exposed surfaces of the raised source/drain regions 68. In one embodiment, the source/drain metal semiconductor alloy portions 70 include a metal silicide.

Figure 13:
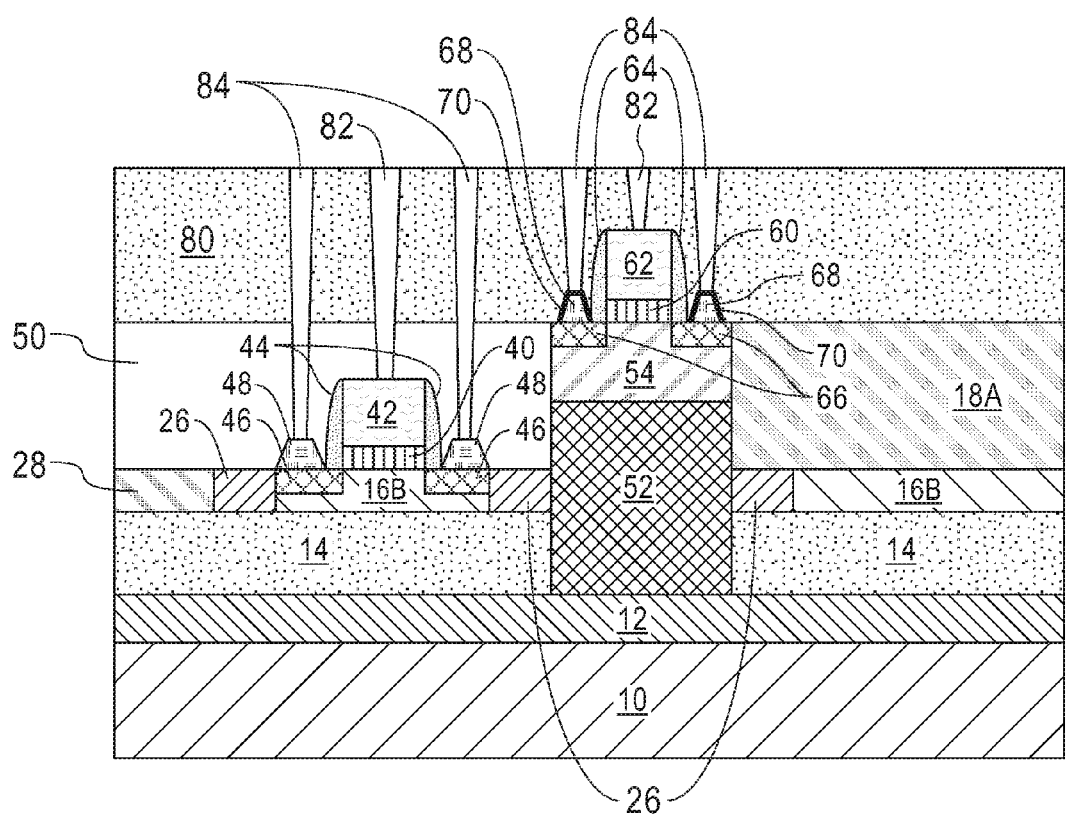
FIG. 13 is a cross-sectional view of the first exemplary semiconductor structure of FIG. 12 after forming contact via structures through a contact level dielectric layer to provide electrical contact to various elements of the PMOS and NMOS transistors.

Referring to FIG. 13, a contact level dielectric layer 80 can be formed over the remaining hard mask layer portion 18A, the gate level dielectric layer 50, the second gate electrode 62, and the second raised source/drain regions 68 or the source/drain metal semiconductor alloy portions 70, if present. The contact level dielectric layer 80 includes a dielectric material such as silicon oxide, silicon nitride, organosilicate glass, or a combination thereof. In some embodiments, the contact level dielectric layer 80 may include a dielectric material the same as the dielectric material of the gate level dielectric layer 50. The contact level dielectric layer 80 can be formed by CVD, PVD or spin coating. If the contact level dielectric layer 80 is not self-planarizing, the top surface of the contact level dielectric layer 80 can be planarized, for example, by chemical mechanical planarization (CMP). The planarized top surface of the contact level dielectric layer 80 is located above the top surface of the second gate electrode 62.

Contact via structures (82, 84) are formed through the contact level dielectric layer 80 to provide electrical contact to various elements of the PMOS and NMOS transistors. The contact via structures include gate contact via structures 82 contacting the first gate electrode 42 and the second gate electrode 62 and source/drain contact via structures 84 contacting the first raised source/drain regions 48 and the second raised source/drain regions 68 or the source/drain metal semiconductor alloy portions 70, if present. The contact via structures (82, 84) can be formed by formation of contact via openings (not shown) by a combination of lithographic patterned and anisotropic etch followed by deposition of a conductive material and plantation that removes an excess portions of the conductive material from above the top surface of the contact level dielectric layer 80.

Figure 14:
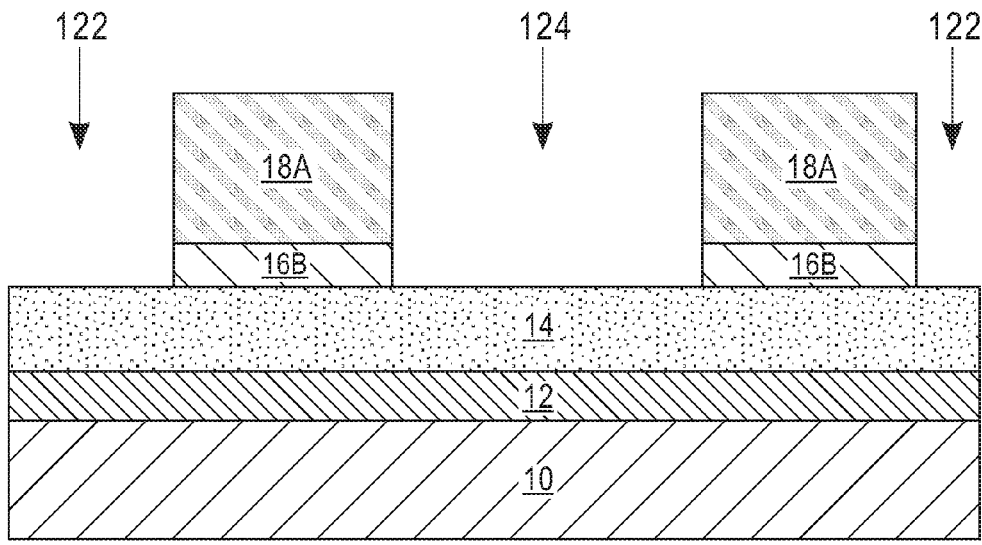
FIG. 14 is a cross-sectional view of a second exemplary semiconductor structure that can be derived from the exemplary semiconductor structure of FIG. 1 after forming at least one first trench and a second trench in the SOI substrate according to a second embodiment of the present application.

Referring to FIG. 14, a second exemplary semiconductor structure of the present application is derived from the exemplary semiconductor structure of FIG. 1 by forming at least one first trench 122 and a second trench 124 utilizing the processing steps described above in FIG. 2. The at least one first trench 122 and the second trench 124 laterally surround a top elemental semiconductor layer portion 16B that can be used to form an elemental semiconductor device, thus defining the first device region.

Figure 15:
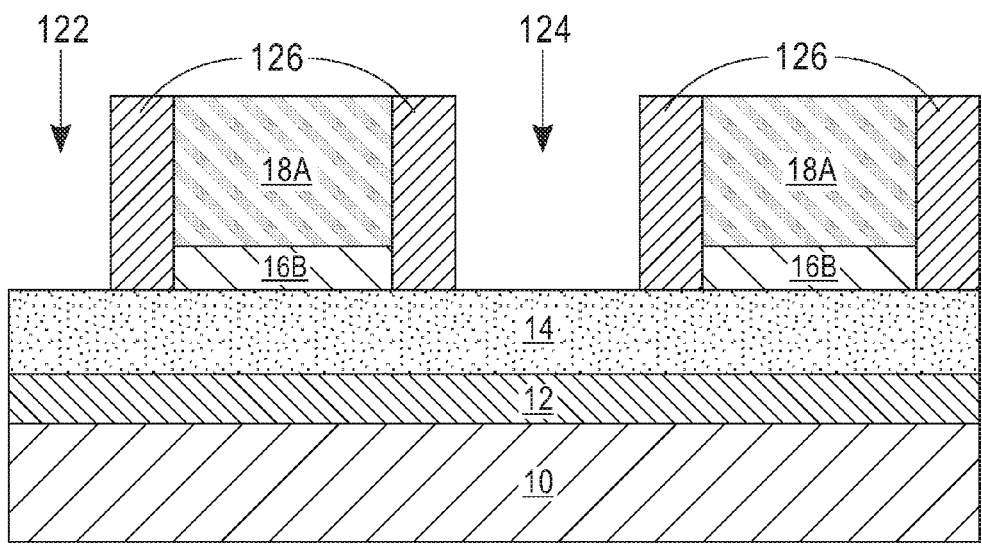
FIG. 15 is a cross-sectional view of the second exemplary semiconductor structure of FIG. 14 after forming spacers on sidewalls of the at least one first trench and the second trench.

Referring to FIG. 15, spacers 126 are formed on sidewalls of the least one first trench 122 and the second trench 124. The spacers 126 can include a dielectric material, such as, for example, a dielectric oxide, a dielectric nitride, or a dielectric oxynitride. The spacers 126 can include the same material as, or a different material, from the hard mask layer 18. The spacers 126 can be formed by conformally depositing a dielectric material on the sidewalls and the bottom surfaces of the at least one first trench 122 and the second trench 124 and the top surfaces of the hard mask layer portions 18A and removing horizontal portions of the deposited dielectric material from the top surfaces of the hard mask layer portions 18A and the bottom surfaces of the at least one first trench 122 and the second trench 124. The remaining vertical portions of the deposited dielectric material constitute spacers 126, which contacts all sidewalls of the top elemental semiconductor layer portions 16B.

Figure 16:
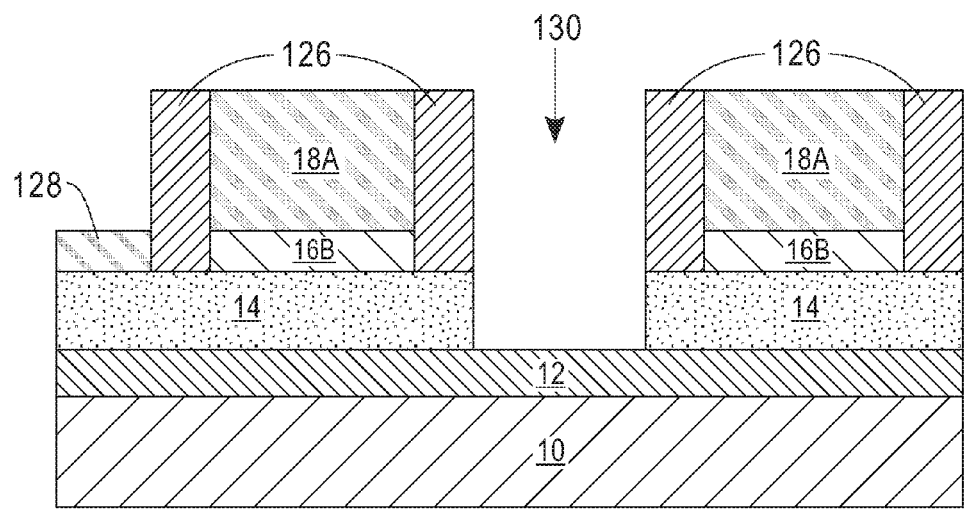
FIG. 16 is a cross-sectional view of the second exemplary semiconductor structure of FIG. 15 after vertically expanding the second trench to provide an expanded second trench.

Referring to FIG. 16, after forming the first trench fill portion 128 utilizing the processing steps described above in FIG. 4, the processing steps described above in FIG. 5 are performed to vertically expand the second trench 124 through the buried insulator layer 14 to provide an extended second trench 130. A surface of the compound semiconductor template layer 12 is physically exposed at the bottom of the expanded second trench 130. The expanded second trench 130 defines the second device region.

Figure 17:
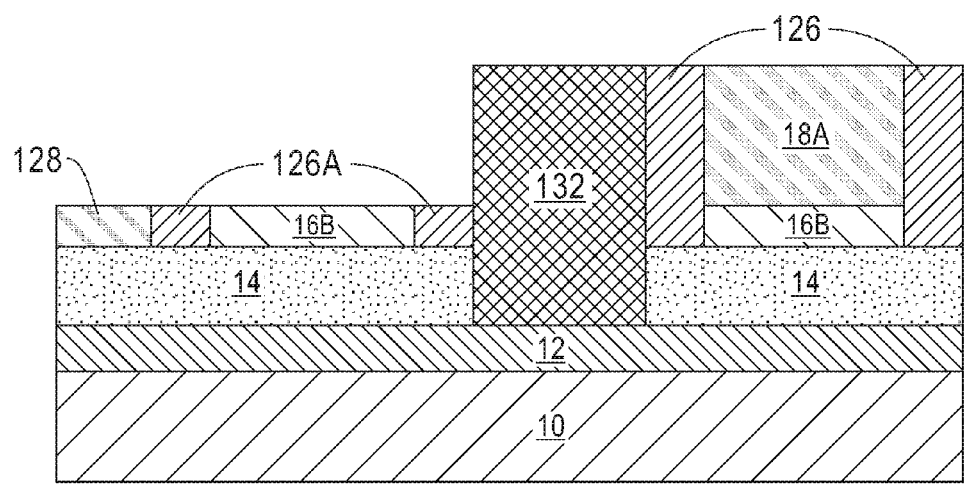
FIG. 17 is a cross-sectional view of the second exemplary semiconductor structure of FIG. 16 after forming isolation regions.

Referring to FIG. 17, after forming the second trench fill portion 132 within the expanded second trench 130 utilizing the processing steps described above in FIG. 6, the processing steps describe above in FIG. 7 are performed to remove one of the hard mask layer portion 18A that is located in the first device region to expose the top elemental semiconductor layer portion 16B located in the first device region. Additionally, if not removed by the etch process employed to remove the hard mask layer portion 18A, portions of the spacers 126 located above the top elemental semiconductor layer portion 16B in the first device region are also removed by, for example, CMP or a recess etch employing the top elemental semiconductor layer portion 16B as a stopping layer. Remaining portions of the spacers 126A function as the isolation regions that electrically isolate the first device region and the second device region.

Subsequently, processing steps described above in FIGS. 8-19 are performed to form a PMOS transistor in the first device region and a NMOS transistor in the second device region.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising
   a substrate comprising a handle substrate, a compound semiconductor template layer present on the handle substrate, and a buried insulator layer present on the compound semiconductor template layer;
   a top elemental semiconductor layer portion present on a first portion of the substrate and in contact with a top surface of the buried insulator layer; and
   a stack of compound semiconductor layers present on a second portion of the substrate and comprising a compound semiconductor buffer layer in contact with a top surface of the compound semiconductor template layer and a top compound semiconductor layer present on the compound semiconductor buffer layer, wherein a lower portion of the stack is laterally surrounded by the buried insulator layer, and wherein an upper portion of the top compound semiconductor layer protrudes above a horizontal plane including a top surface of the top elemental semiconductor layer portion.

2. The semiconductor structure of claim 1, wherein the compound semiconductor template layer comprises germanium or silicon germanium.

3. The semiconductor structure of claim 1, wherein the compound semiconductor buffer layer has a first band gap, and the top compound semiconductor layer has a second band gap smaller than the first band gap.

4. The semiconductor structure of claim 3, wherein the compound semiconductor buffer layer comprises InP, GaAs, InAlAs, AlAs, AlGaAs, or InGaAs.

5. The semiconductor structure of claim 4, wherein the compound semiconductor buffer layer is doped with iron, chromium, titanium, or vanadium.

6. The semiconductor structure of claim 3, wherein the top compound semiconductor layer comprises InGaAs, InAs, GaAs, or InP.

7. The semiconductor structure of claim 1, wherein the top elemental semiconductor layer portion comprises silicon or germanium.

8. The semiconductor structure of claim 1, wherein the handle substrate is a silicon substrate.

9. The semiconductor structure of claim 1, wherein the top elemental semiconductor layer portion is electrically isolated from the stack of the compound semiconductor layers by isolation regions.

10. The semiconductor structure of claim 1, further comprising:
    a first field effect transistor located on the substrate, wherein the top elemental semiconductor layer portion comprises a channel region, a source region and a drain region of the first field effect transistor; and a second field effect transistor located on the substrate, wherein the top compound semiconductor layer comprises a channel region, a source region and a drain region of the second field effect transistor.

11. A method of forming a semiconductor structure comprising:

provided a semiconductor-on-insulator (SOI) substrate comprising a handle substrate, a compound semiconductor template layer present on the handle substrate, a buried insulator layer present on the compound semiconductor template layer, and a top elemental semiconductor layer present on the buried insulator layer;

forming a hard mask layer over the top elemental semiconductor layer;

forming a first trench and a second trench through the hard mask layer and the top elemental semiconductor layer, the first trench and the second trench exposing a top surface of the buried insulator layer;

forming isolation regions around sidewalls of the first trench and the second trench to provide a top elemental semiconductor layer portion laterally surrounded by the isolation regions;

vertically expanding the second trench through the buried insulator layer to provide an expanded second trench that exposes a top surface of the compound semiconductor template layer;

filling the expanded second trench with a dielectric material to provide a second trench fill portion;

removing a portion of the hard mask layer from the top elemental semiconductor portion;

forming a first semiconductor device on the top elemental semiconductor portion;

forming a gate level dielectric layer to cover the first semiconductor device;

removing the second trench fill portion from the expanded second trench to re-expose the top surface of the compound semiconductor template layer;

epitaxially growing a stack of compound semiconductor layers comprising a compound semiconductor buffer layer and a top compound semiconductor layer within the expanded second trench; and forming a second semiconductor device on the top compound semiconductor layer.

12. The method of claim 11, wherein the forming the isolation regions is performed by a thermal oxidation of portions of a patterned top elemental semiconductor layer around the first trench and the second trench.

13. The method of claim 11, wherein the forming the isolation regions is performed by forming spacers on sidewalls of the first trench and the second trench and removing portions of the spacers that are located above the top elemental semiconductor layer portion.

14. The method of claim 11, further comprising filling the first trench with a dielectric material to provide a first trench fill portion prior to the vertically expanding the second trench.

15. The method of claim 11, wherein the expanded second trench has an aspect ratio greater than 1.0.

16. The method of claim 11, wherein the compound semiconductor buffer layer is in direct contact with the compound semiconductor template layer.

17. The method of claim 11, wherein the compound semiconductor template layer comprise germanium or silicon germanium.

18. The method of claim 11, wherein the forming the first semiconductor device comprises:

forming a first gate structure on a portion of the top elemental semiconductor layer portion, the first gate structure in contact with a channel portion of the top elemental semiconductor layer portion;

forming a first source region and a first drain region in portions of the top elemental semiconductor layer portion on opposite sides of the channel portion of the top elemental semiconductor layer portion; and forming a first raised source region on the first source region and a first raised drain region on the first drain region.

19. The method of claim 11, wherein the forming the second semiconductor device comprises:

forming a second gate structure on a portion of the top compound semiconductor layer, the second gate structure in contact with a channel portion of the top compound semiconductor layer portion;

forming a second source region and a second drain region in portions of the top compound semiconductor layer on opposite sides of the channel portion of the top compound semiconductor layer portion; and forming a second raised source region on the second source region and a second raised drain region on the second drain region.

* * * * *